United States Patent [19]

Kawakatsu

[11] Patent Number: 4,946,798
[45] Date of Patent: Aug. 7, 1990

[54] SEMICONDUCTOR INTEGRATED CIRCUIT FABRICATION METHOD

[75] Inventor: Akira Kawakatsu, Tokyo, Japan

[73] Assignee: Oki Electric Industry Co., Ltd., Japan

[21] Appl. No.: 305,735

[22] Filed: Feb. 2, 1989

[30] Foreign Application Priority Data

Feb. 9, 1988 [JP] Japan .................. 63-26670
Mar. 4, 1988 [JP] Japan .................. 63-49715
Mar. 4, 1988 [JP] Japan .................. 63-49717

[51] Int. Cl.⁵ ........................................ H01L 21/331
[52] U.S. Cl. ........................................ 437/33; 437/31;
437/162; 437/968; 357/34; 357/59
[58] Field of Search .................. 437/31, 32, 33, 162,
437/233, 228, 241, 968; 357/34, 59 H

[56] References Cited

U.S. PATENT DOCUMENTS

| 4,338,138 | 7/1982 | Cavaliere | 437/968 |
| 4,495,010 | 1/1985 | Kranzer | 437/33 |
| 4,735,912 | 4/1988 | Karakatsa | 437/162 |
| 4,778,774 | 10/1988 | Blassfeld | 437/59 |
| 4,780,427 | 10/1988 | Sakai et al. | 437/968 |
| 4,783,422 | 11/1988 | Kawakatsa | 437/162 |

FOREIGN PATENT DOCUMENTS 290173 12/1987 Japan .

OTHER PUBLICATIONS

Wolf et al., "Silican Processing...", 1986 pp. 186-189.
Sze "Vlsi Tech.", 1983 pp. 106-109.

Primary Examiner—Brian E. Hearn
Assistant Examiner—Kevin McAndrews
Attorney, Agent, or Firm—Edward D. Manzo

[57] ABSTRACT

In a semiconductor integrated circuit fabrication method, isolated regions are in a silicon substrate, which is then covered with polysilicon, a passive base region is then formed, the polysilicon is selectively oxidized, the unoxidized polysilicon is then doped at first and second concentrations, a surface insulating layer is then deposited, the dopant is then diffused from the polysilicon to create further passive and active base regions, contact holes are then opened, the polysilicon above the active base is then doped, and this dopant is then diffused to create an emitter region in the active base. By employing a polysilicon layer with reduced initial thickness, this fabrication method enables precise doping with excellent control over the active base concentration, junction depth, polysilicon sheet resistance, and other parameters. It also enables the base junction depth to be reduced and the eptitaxial layer to be made thinner than before, leading to a high gain-bandwidth product, high switching speed, and generally reduced device dimensions.

42 Claims, 5 Drawing Sheets

SEMICONDUCTOR INTEGRATED CIRCUIT FABRICATION METHOD

BACKGROUND OF THE INVENTION

This invention relates to a method of fabrication of semiconductor integrated circuits, more particularly of bipolar semiconductor integrated circuits suitable for high levels of integration and high-speed operation.

High-speed semiconductor integrated circuits generally employ bipolar emitter-coupled logic or current-mode logic. To improve the speed of these devices, it is necessary to reduce the parasitic capacitance of their circuit elements and interconnection wiring, reduce the base resistance of their transistors, and increase the transistor gain-bandwidth product, i.e. the transistor cutoff frequency.

A major contribution to the parasitic capacitance is made by the capacitance of the base-collector junctions in the transistors. A widely-adopted scheme for reducing the parasitic capacitance is to reduce the area of these junctions by using a polysilicon lead to connect the base with an electrode out side the transistor area. An effective method of reducing the parasitic capacitance of the polysilicon resistors and metal interconnection wiring is to form these on a thick isolation oxide layer.

To reduce the base resistance, it is necessary to reduce the width of the emitter, reduce the resistance of the active base layer disposed thereunder, and bring the low-resistance passive base closer to the emitter. An effective way to improve the gain-bandwidth product is to reduce the depth of the emitter-base junction and reduce the thickness of the epitaxial layer in which the collector, emitter, and base are formed.

The foregoing measures have been taken in a prior-art fabrication method described in Japanese Laid-open Patent Application No. 290173/1987, comprising a first step for creating mutually isolated device regions on a P− silicon substrate, a second step for creating a first part of the passive base by medium-concentration boron ion implantation, a third step for creating polysilicon electrodes and resistors, a fourth step for implanting a high concentration of boron ions into the polysilicon base electrodes and the ends of the polysilicon resistors, a fifth step for implanting low-concentration boron ions into the polysilicon electrodes and resistors and diffusing the implanted boron ions into the underlying silicon to complete the formation of the base, a sixth step for opening contact holes, a seventh step for forming a thin oxide film on the polysilicon surface exposed in the contact holes, an eighth step for implanting arsenic ions through the thin oxide film into the polysilicon in the contact holes, a ninth step for diffusing the arsenic ions to form an emitter in the active base region, and a tenth step for metalization. This fabrication method creates fairly high-performance transistors having a reduced base area, a shallow baseemitter junction, and the other requisites mentioned above.

A problem in the method just described is that in the fourth step, the boron ions are implanted into the polysilicon through a comparatively thick protective oxide layer created by oxidizing the upper 1800 to 2000 angstroms of the polysilicon. A substantial percentage of the implanted ions is trapped in the oxide layer and does not reach the polysilicon. Accordingly, irregularities in the oxide thickness create substantial variations in the amount of boron actually implanted in the polysilicon; this leads to problems of nonuniformity and non-reproducibility of transistor characteristics and resistance values.

A related problem is that to allow for the thick oxidation, the original polysilicon layer must itself be thick, so that much time is needed for selectively oxidizing the polysilicon areas to create the electrodes and resistors in the third step. A result is that the original medium-concentration base is deepened and the epitaxial layer in which the base and collector are formed must be thick enough to accommodate this depth; both of these factors limit the improvement in the gain-bandwidth product. In addition, the extension of the medium-concentration base into the region below the emitter limits the reduction of the emitter width and reduction of the base resistance, enlarges the emitterbase capacitance, thereby limiting the transistor switching speed, and reduces the width of the active base, thereby limiting the current gain of the transistor. The long selective oxidation time furthermore allows oxidation to proceed in the horizontal direction and promotes the growth of "bird's-beaks," which in turn limits the fineness of the structures that can be realized.

Yet another problem is that the preceding method is not suitable for creating arsenic-doped polysilicon resistors with very low sheet resistance values.

SUMMARY OF THE INVENTION

It is accordingly an object of this invention to provide a semiconductor integrated circuit fabrication method suitable for finely patterned circuits in which the problems resulting from nonuniformity of ion concentrations in the polysilicon and the large original thickness of the polysilicon are eliminated and the transistors created have highly reproducible characteristics, an improved gain-bandwidth product, reduced base resistance, increased switching speed, and increased current gain.

It is also an object of this invention to provide a semiconductor integrated circuit fabrication method suitable for the creation of polysilicon resistors with very low sheet resistances.

A first embodiment of a semiconductor integrated circuit fabrication method according to this invention comprises a first step for creating isolated regions of a first conductive type in a silicon substrate and covering the principal surface of the silicon substrate with a layer of polysilicon overlain by an oxidation-resistant layer. A second step selectively removes parts of the oxidation-resistant layer and forming a first passive base region of a second conductive type. A third step selectively oxidizes the polysilicon, using the oxidation-resistant layer as a mask, then removes the oxidation-resistant layer. A fourth step introduces a dopant of the second conductive type at a high concentration into part of the unoxidized polysilicon, and at a lower concentration into the rest of the unoxidized polysilicon. A fifth step covers the entire surface with an insulating layer, then diffuses the dopant of the fourth step from the polysilicon into the underlying silicon to form a second passive base region and an active base region. A sixth step opens contact holes. A seventh step introduces a dopant of the first conductive type into the exposed polysilicon surface disposed above the active base region. An eighth step diffuses of this dopant to create an emitter region within the active base region. A ninth step is for metallization.

A second embodiment of a semiconductor integrated circuit fabrication method according to this invention is similar to the first, but differs in the order of the fifth through eighth steps: after the second passive base region and the active base region are formed in the fifth step, a dopant of the first conductive type is introduced into the polysilicon above the active base region; the insulating layer is formed in the sixth step; the emitter region is created by diffusion in the seventh step; and contact holes are opened in the eighth step.

A third embodiment of a semiconductor integrated circuit fabrication method according to this invention is similar to the second, differing only in the sixth and seventh steps: the emitter region is created by diffusion in the sixth step; in the seventh step, first a metal silicide layer is formed on parts of the polysilicon, including the part that will become the base electrode, then the insulating layer is formed.

DETAILED DESCRIPTION OF THE PREFERRED EMBODIMENTS

A first novel semiconductor integrated circuit fabrication method according to this invention will be described with reference to the process diagrams in FIG. 1A to FIG. 1I.

Figure 1A:
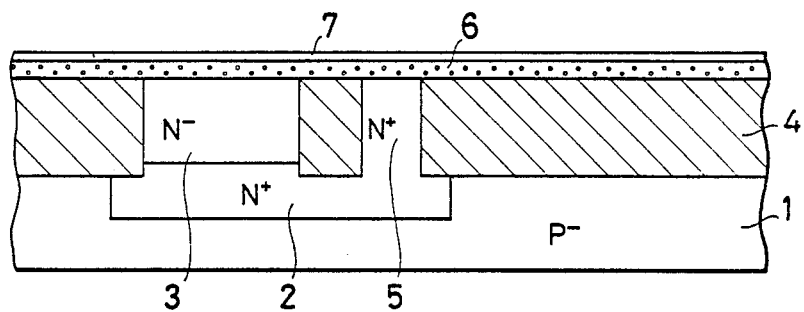
FIGS. 1A to 1I are process diagrams illustrating a first semiconductor integrated circuit fabrication method according to the present invention.

The fabrication process begins with the element isolation step shown in FIG. 1A. Starting from a wafer comprising a $P^-$-type silicon substrate 1, first an $N^+$-type buried layer 2 is created, then an $N^-$-type epitaxial layer 3 is grown and separated into isolated regions by an isolation oxide layer 4. Each isolated region comprises two distinct islands interconnected by the $N^+$-type buried layer 2. An impurity is diffused into one of the islands, making it into an $N^+$-type collector sink region 5. The remaining $N^-$-type island of the epitaxial layer 3 will become the collector region and will contain the base and emitter regions of the transistor. Next the entire surface is covered with a layer of polysilicon 6 and an oxidation-resistant layer 7. The oxidation-resistant layer 7 has a dual structure, comprising a thin lower oxide layer and an upper nitride layer.

Figure 1B:
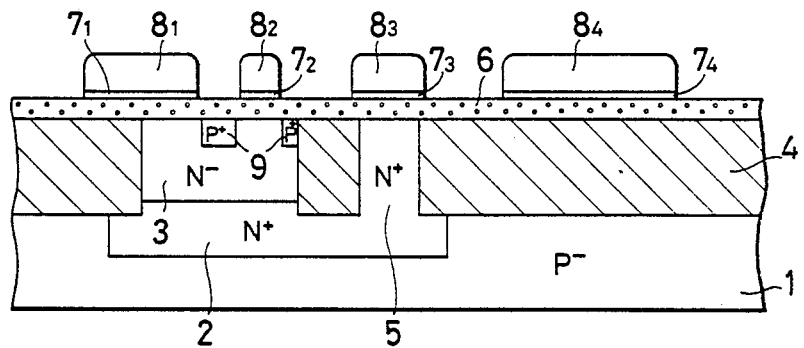

The second step is a boron ion implantation step. As shown in FIG. 1B, the oxidation-resistant layer 7 is etched using resists $8_1$ to $8_4$, leaving oxidation-resistant layers $7_1$ to $7_4$. Then, using the resists $8_1$ to $8_4$ and the oxidation-resistant layers $7_1$ to $7_4$ as a mask, boron ions are implanted into selected parts of the $N^-$-type epitaxial layer 3 to create a medium-doped base 9 that will become the first part of the passive base inside the collector region.

Figure 1C:
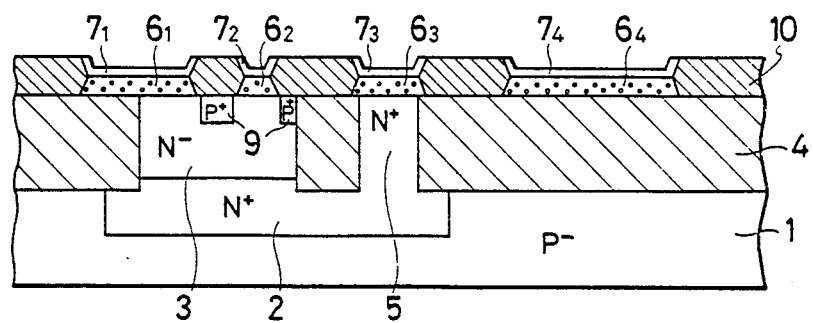

The third step is an oxidation step. The resists $8_1$ to $8_4$ are removed and the polysilicon 6 is selectively oxidized, using the oxidation-resistant layers $7_1$ to $7_4$ as a mask, to create an oxide layer 10. The oxide layer 10 divides the polysilicon 6 into polysilicon regions $6_1$ to $6_3$ that will become the transistor electrodes and a polysilicon region $6_4$ that will become a resistor, as shown in FIG. 1C.

The steps so far are similar to the prior art, but differ in that the original polysilicon 6 is not as thick, so the ion implantation energy used in creating the medium-doped base 9 can be reduced and the oxide layer 10 is thinner. In the prior art the initial thickness of the polysilicon and its final thickness were, for example, 3000 angstroms and 2000 angstroms. In the novel fabrication method, since the polysilicon thickness is reduced very little in subsequent steps, its initial thickness can be 2000 angstroms. This permits the boron ion implantation energy used to form the medium-doped base 9 to be reduced from 150 keV in the prior art to 100 keV in the novel method, and the heat treatment time for selective oxidation to be reduced by half.

Figure 1D:
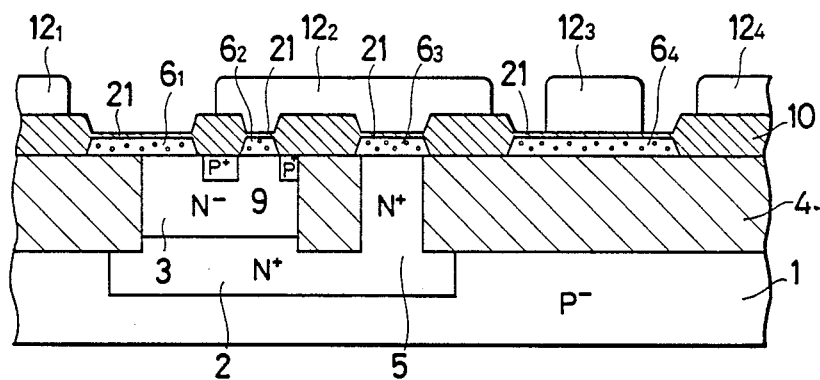

The fourth step is another boron ion implantation step. The oxidation-resistant layers $7_1$ to $7_4$ are removed and the surfaces of the polysilicon regions $6_1$ to $6_4$ are thinly oxidized to create a thin oxide layer 21 with a thickness of about 100 to 200 angstroms as shown in FIG. 1D. Then resists $12_1$ to $12_4$ are formed as a mask and boron ions are implanted with an energy of 30 keV and concentration of $2 \times 10^{15}$ cm$^{-2}$ into all of the polysilicon region $6_1$ and into the two ends of the polysilicon region $6_4$. The purpose of the thin oxide layer 21 is to prevent outdiffusion (diffusion out of the upper surface of polysilicon) of the boron during the diffusion of boron into the epitaxial layer 3 in the subsequent step to be described later, but as boron has a low vapor pressure, the thin oxide layer 21 is not essential and can be omitted.

Next, the resists $12_1$ to $12_4$ are removed and boron ions are implanted again with the same energy as previously but a lower concentration of $4 \times 10^{14}$ cm$^{-2}$ into the polysilicon regions $6_1$ to $6_4$.

Figure 1E:
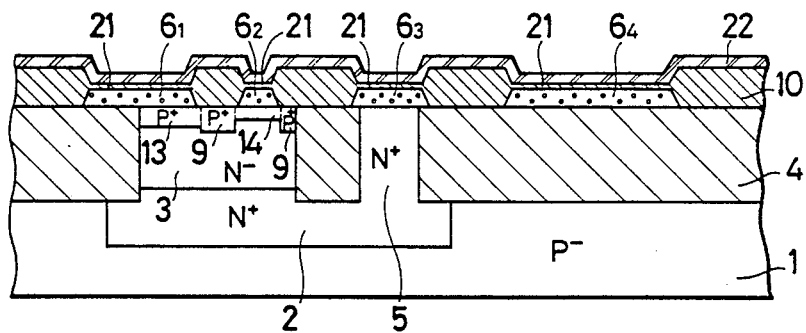
Figure 1F:
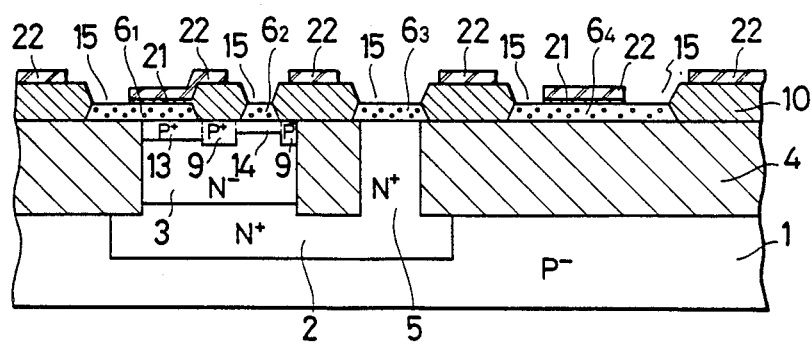

The fifth step is a chemical vapor deposition (CVD) and annealing step. A CVD oxide layer 22 with a thickness of 1500 to 2500 angstroms is deposited over the entire surface as shown in FIG. 1E and the wafer is heated for annealing as necessary to diffuse the boron from the polysilicon regions $6_1$ and $6_2$ into the $N^-$-type epitaxial layer 3, thus creating a passive base 13 and an active base 14 which are contiguous with the medium-doped base 9. The above-mentioned heating for annealing may be omitted where heating during subsequent chemical vapor deposition, in which the temperature is raised to 900° C., also gives sufficient effect of annealing.

The succeeding steps are similar to the prior art. In the sixth step, shown in FIG. 1F, the CVD oxide layer 22 and the thin oxide layer 21 are selectively removed to create contact holes 15 that expose the polysilicon regions $6_2$ and $6_3$ and parts of the polysilicon regions $6_1$ and $6_4$.

Figure 1G:
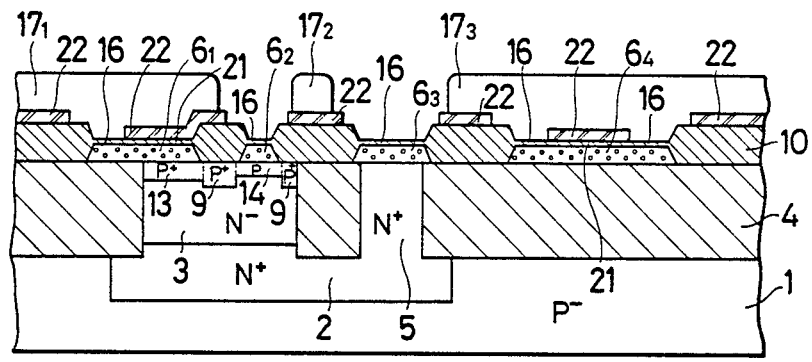

The seventh step, shown in FIG. 1G, is an arsenic ion implantation step. The exposed polysilicon surfaces $6_1$ to $6_4$ are thinly oxidized by a thermal oxidization process to create a thin oxide layer 16. Resists $17_1$ to $17_3$ are then created and arsenic ions are implanted with high concentration into the polysilicon regions $6_2$ and $6_3$, using the resists $17_1$ to $17_3$ as a mask.

Figure 1H:
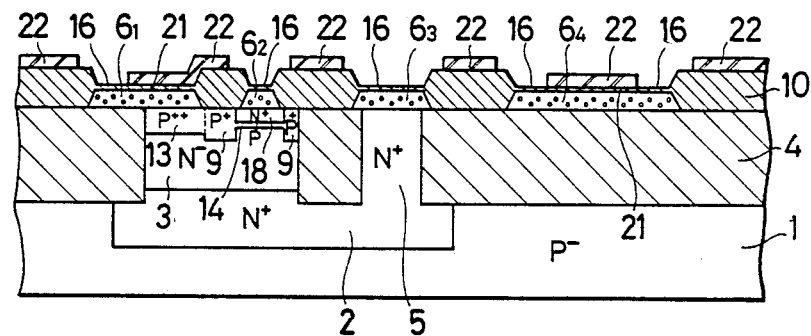

The eighth step is an annealing step. The resists $17_1$ to $17_3$ are removed and an annealing process is performed to diffuse the arsenic from the polysilicon region $6_2$ into part of the active base 14, thus forming an emitter 18 as shown in FIG. 1H.

Figure 1I:
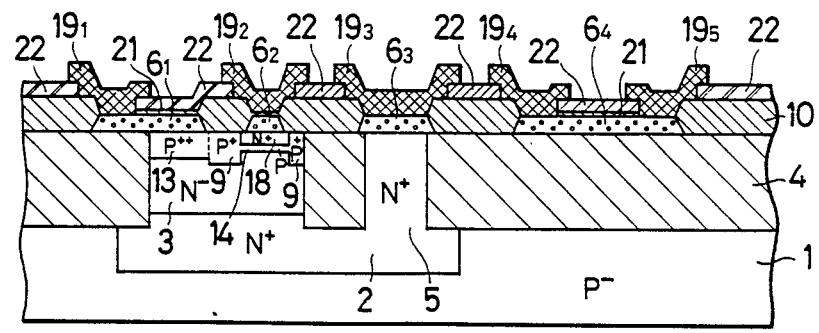

In the ninth and final step, the thin oxide layer 16 is removed from the contact holes and the wafer is metalized to create metal electrodes $19_1$ to $19_5$. FIG. 1I shows the final structure.

The polysilicon region $6_4$ formed in the foregoing process has a high sheet resistance of about 1 kilohm. A lower sheet resistance of about 200 ohms can be obtained by eliminating the resist $12_3$ and doping the entire resistor region with boron at a high concentration of $2.4 \times 10^{15}$ cm$^{-2}$.

As compared with the prior-art process in which boron was implanted through a thick protective oxide layer that trapped a substantial percentage of the ions and gave rise to nonuniformities in the implantation concentration, the novel fabrication process uses only a thin surface oxide layer, or dispenses with the thin oxide layer altogether, allowing about all of the ions to be implanted in the polysilicon. The dopant concentration can therefore be precisely controlled. As a result, the active base concentration, the junction depth, the sheet resistance of the polysilicon, and other parameters can be made more consistent than before, with marked improvement in the reproducibility and uniformity of the transistor characteristics and resistance values.

In addition, since the novel process reduces the polysilicon thickness very little, the initial thickness of the polysilicon layer can be small, hence the ion implantation energy for forming the medium-doped base and the heat treatment time for selective oxidation of the polysilicon can be reduced. The junction depth of the medium-doped base, which is the deepest of the base junction depths, can therefore be reduced, reducing the flow of carriers to the region directly below the emitter. In consequence, the thickness of the epitaxial layer and the width of the emitter can be reduced, hence the gain-bandwidth product can be improved and switching speed can be increased. A further gain in switching speed results from the reduction of the emitter-base junction capacitance. Another advantage of the novel process is that the active base can be widened, thus raising the current gain of the transistor.

Still another advantage gained from the reduction of the selectively oxidized layer is that the length of the bird's-beak structure formed by oxidation in the horizontal direction is reduced; hence not only the emitter width but the dimensions of the entire device can be reduced, resulting in less parasitic capacitance, higher-speed operation, less power dissipation, and higher levels of integration.

Next a second novel semiconductor integrated circuit fabrication method according to this invention will be described. This method is identical to the first method in its first four steps shown in FIGS. 1A to 1D, but differs in the order of the subsequent steps. Since the first four steps have already been described with reference to FIGS. 1A to 1D, the explanation of the second novel method will be confined to the fifth and subsequent steps, which are illustrated in FIGS. 2E to 2G.

Figure 2E:
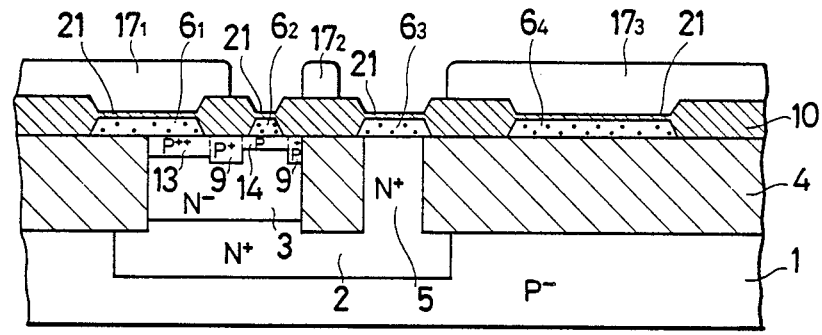
FIGS. 2E to 2G are process diagrams illustrating the fifth and subsequent steps of a second semiconductor integrated circuit fabrication method according to the present invention.
Figure 2F:
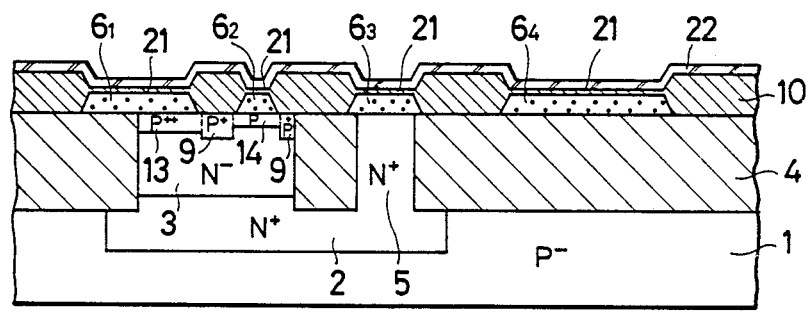

In the second novel method, following the implantation of boron ions into the polysilicon regions $6_1$ to $6_4$ in the fourth step shown in FIG. 1D, the fifth step is an annealing and arsenic ion implantation step, illustrated in FIG. 2E. First the wafer is annealed in a non-oxidizing atmosphere to diffuse the boron from the polysilicon regions $6_1$ and $6_2$, into which boron ions were implanted with a concentration of $4 \times 10^{-14}$ cm$^{-2}$, thus creating a passive base 13 and an active base 14 in the N$^-$-type epitaxial layer 3. As in the first novel fabrication method, the passive base 13 and an active base 14 are contiguous with the medium-doped base 9. Next resists $17_1$ to $17_3$ are formed as shown in FIG. 2E. Using the resists $17_1$ to $17_3$ as a mask, arsenic ions are implanted with an energy of 40 keV to 60 keV and concentration of $1 \times 10^{16}$ cm$^{-2}$ to $2 \times 10^{16}$ cm$^{-2}$ into the polysilicon regions $6_2$ and $6_3$.

The sixth step is a chemical vapor deposition step. The resists $17_1$ to $17_3$ are removed and a CVD oxide layer 22 about 2000 angstroms thick is deposited on the entire surface; that is, on the polysilicon regions $6_1$ to $6_4$ and the oxide layer 10 as shown in FIG. 2F.

Figure 2G:
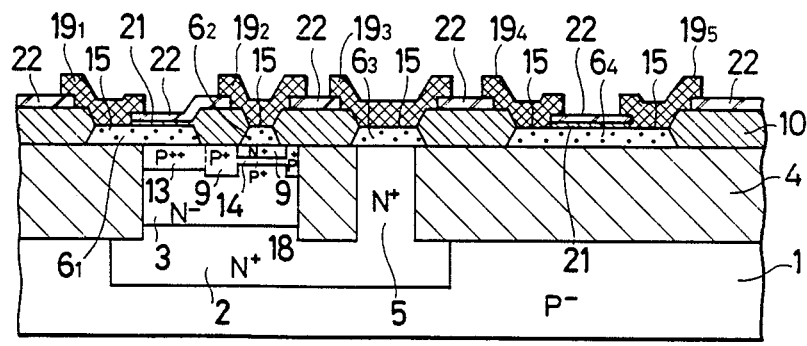

FIG. 2G illustrates the seventh to ninth steps. The seventh step is another annealing step performed in a nonoxidizing atmosphere. This step diffuses the arsenic from the polysilicon region $6_2$, thereby creating an emitter 18 in the active base 14 as shown.

In the eighth step, contact holes 15 are opened in the CVD oxide layer 22 and the thin oxide layer 21 by standard photo-litho-etching techniques (photolithography).

In the ninth and final step, the wafer is metalized to create metal electrodes $19_1$ to $19_5$. The final structure is illustrated in FIG. 2G.

The thickness of the thin oxide layer 21 in the second novel fabrication method can be from about 100 to about 200 angstroms. Alternatively, as noted in the first novel fabrication method, the thin oxide layer 21 can be omitted.

As in the first novel fabrication method, the polysilicon region $6_4$ has a high sheet resistance of about 1 kilohms, but a lower sheet resistance of about 200 ohms can be obtained by eliminating the resist $12_3$ and doping the entire resistor polysilicon region $6_4$ with boron at a high concentration of $2.4 \times 10^{15}$ cm$^{-2}$.

An even lower sheet resistance of about 50 ohms can be obtained by leaving the polysilicon region $6_4$ masked in FIG. 1D, so that it does not receive any high-concentration ion implantation, then removing the resist $17_3$ in FIG. 2E and implanting arsenic ions into the polysilicon region $6_4$ before the CVD oxide layer 22 is formed. This arsenic ion implantation does not require an extra photo-litho-etching step; the photo-litho-etching process used to open the contact holes 15 in the CVD oxide layer 22 and the thin oxide layer 21 remains the only photo-litho-etching process required.

In the prior-art fabrication method it would be extremely difficult to obtain an arsenic-doped polysilicon resistor because of the thick oxide layer overlying the polysilicon even after the resist $17_3$ is removed. If this oxide layer is removed in order to implant arsenic ions, no step height is left for self-alignment of the contact holes. Furthermore, a separate photo-litho-etching step would be required to remove the oxide. For these reasons it is just about impossible to create a low-resistance arsenic-doped polysilicon resistor in the prior-art method.

The second novel fabrication method has the same advantages as the first, with the further advantage that it can be easily modified to obtain arsenic-doped resistors with a low sheet resistance of about 50 ohms, without requiring an extra photo-litho-etching step.

A third novel semiconductor integrated circuit fabrication method according to the present invention will be explained with reference to FIGS. 1A to 1D, 2E, and 3F to 3H. The third fabrication method has the same objectives as the first two and the additional objective of reducing the sheet resistance of the base electrode polysilicon region $6_1$.

The first five steps of the third novel fabrication method are identical to the first five steps of the second novel fabrication method, shown in FIGS. 1A to 1D and FIG. 2E, ending in the implantation of arsenic ions with an energy of 40 keV to 60 keV and concentration of $1 \times 10^{16}$ cm$^{-2}$ to $2 \times 10^{16}$ cm$^{-2}$ in FIG. 2E.

Figure 3F:
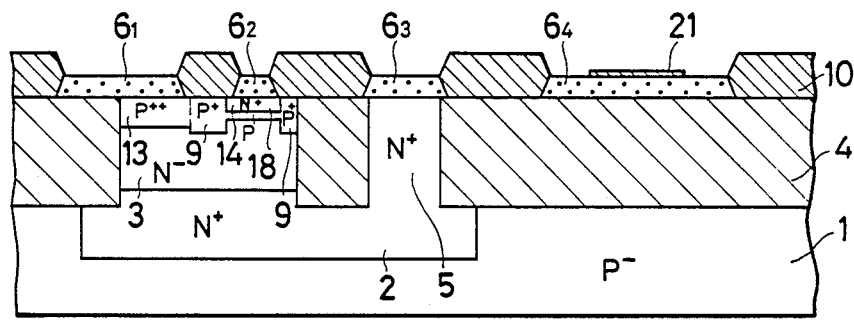
FIGS. 3F to 3H are process diagrams illustrating the sixth and subsequent steps of a third semiconductor integrated circuit fabrication method according to the present invention.

The sixth step is an annealing step. The resists $17_1$ to $17_3$ in FIG. 2E are removed and an annealing process is performed in a non-oxidizing atmosphere to diffuse the arsenic ions from the polysilicon region $6_2$ into the active base 14, thereby creating an emitter 18 as shown in FIG. 3F. Differing from the second novel fabrication method, this annealing process is performed before deposition of the CVD oxide layer 22. Next the thin oxide layer 21 is removed from the polysilicon regions $6_1$ to $6_4$, except that it is not removed from the central portion of the polysilicon region $6_4$ which will become the resistor.

Figure 3G:
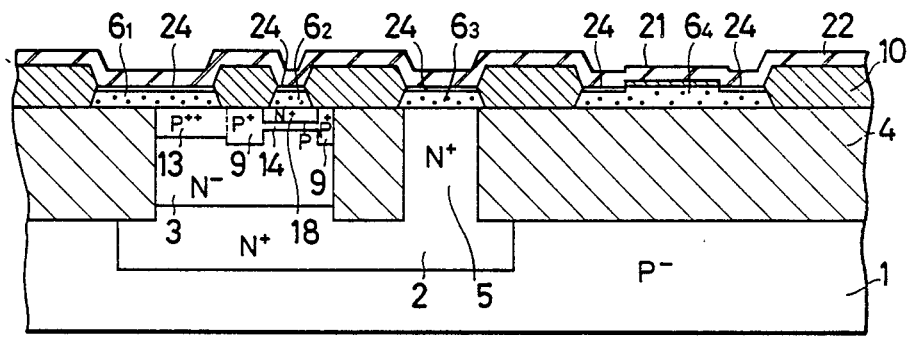

The seventh step, shown in FIG. 3G, is a silicide formation and chemical vapor deposition step. First a layer of platinum silicide 24 is formed by a well-known method on the exposed surfaces of the polysilicon regions $6_1$ to $6_4$. Next a low-temperature process such as plasma chemical vapor deposition is used to deposit a CVD oxide layer 22 over the entire surface; that is, over the polysilicon regions $6_1$ to $6_4$, the platinum silicide 24, and the oxide layer 10.

Figure 3H:
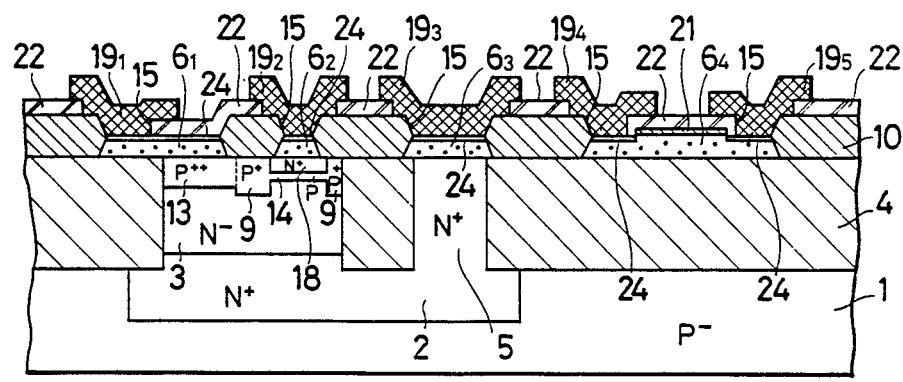

FIG. 3H illustrates the eighth and ninth steps. In the eighth step, contact holes 15 are opened in the CVD oxide layer 22 by standard photo-litho-etching techniques. In the ninth and final step, the wafer is metalized to create metal electrodes $19_1$ to $19_5$. FIG. 3H illustrates the final structure.

The foregoing third novel fabrication method creates a boron-doped polysilicon region $6_4$ with a sheet resistance of about 1 kilohm. The process can be modified, however, to obtain a boron-doped polysilicon region $6_4$ with a sheet resistance of about 200 ohms as explained in connection with the first novel fabrication method, or an arsenic-doped polysilicon region $6_4$ with a sheet resistance of about 50 ohms as explained in connection with the second novel fabrication method.

The third novel fabrication method provides the same advantages as the first and second novel fabrication methods. In addition, the metal silicide coating on the surface of the polysilicon forming the base electrode reduces the sheet resistance of this electrode to only a few ohms, thus greatly reducing the external base resistance without changing the device dimensions. The reduced base resistance combines with the improved gain-bandwidth product and reduced parasitic capacitance to improve the transistor switching speed, reduce power dissipation, and enable higher levels of integration to be obtained.

The scope of this invention is not limited to the preceding embodiments but includes numerous modifications that will be obvious to one skilled in the art. For example, it is possible for the conductive types shown in the drawings to be reversed, so that the layers shown as P-type are N-type and vice versa. Also, in the third novel fabrication method described above, instead of platinum silicide, it is possible to use another metal silicide such as tantalum silicide or molybdenum silicide.

What is claimed is:

1. A semiconductor integrated circuit fabrication method, comprising:
    first, creating isolated regions of a first conductive type in a silicon substrate, depositing polysilicon on the principal surface of said silicon substrate including said isolated regions, and forming an oxidation-resistant layer on the exposed surface of said polysilicon;
    second, selectively removing parts of said oxidation-resistant layer and forming, in part of said isolated regions of said first conductive type not overlain by said oxidation-resistant layer, a first passive base region of a second conductive type;
    third, selectively oxidizing said polysilicon, using said oxidation-resistant layer as a mask, then removing said oxidation-resistant layer;
    fourth, introducing a dopant of said second conductive type at a first concentration into part of said polysilicon left unoxidized by said third step, and at a second concentration, lower than said first concentration, into all of said polysilicon left unoxidized by said third step;
    fifth, depositing an insulating layer on both the oxidized and unoxidized parts of said polysilicon surface by chemical vapor deposition, then forming a second passive base region and an active base region of said second conductive type of diffusion of said dopant of said second conductive type from said polysilicon into said isolated regions of said first conductive type, said second passive base and active base regions being contiguous with said first passive base region;
    sixth, selectively removing parts of said insulating layer to create contact holes in which the surface of said polysilicon is exposed;
    seventh, introducing a dopant of said first conductive type into said exposed polysilicon surface disposed above said active base region;
    eigth, diffusing said dopant of said first conductive type to create an emitter region of said first conductive type within said active base region; and
    ninth, forming metal electrodes in said contact holes.

2. A semiconductor integrated circuit fabrication method according to claim 1, wherein said polysilicon is deposited in said first step with a thickness of about 2000 angstroms.

3. A semiconductor integrated circuit fabrication method according to claim 2 wherein, in said second step, said first passive base region of said second conductive type is formed by implantation of boron ions with an energy of about 100keV.

4. A semiconductor integrated circuit fabrication method according to claim 1, further comprising a tenth step performed between said third step and said fourth step, for oxidizing said remaining unoxidized polysilicon surface to a thickness sufficient to prevent outdiffusion of the dopant in said polysilicon during said diffusion in said fifth step.

5. A semiconductor integrated circuit fabrication method according to claim 4, wherein said tenth step comprises oxidizing said remaining unoxidized polysilicon surface to a thickness of about 100 to 200 angstroms.

6. A semiconductor integrated circuit fabrication method according to claim 1, further comprising an eleventh step performed between said sixth step and said seventh step, for oxidizing said exposed polysilicon surface to a thickness sufficient to prevent outdiffusion of the dopant in said polysilicon during said diffusion in said seventh step.

7. a semiconductor integrated circuit fabrication method according to claim 6, wherein said eleventh step comprises oxidizing said remaining unoxidized polysilicon surface to a thickness of about 100 to 200 angstroms.

8. A semiconductor integrated circuit fabrication method according to claim 1, wherein said dopant of said second conductive type employed in said fourth step is boron, said fourth step is carried out by ion implantation at an energy of about 30keV, said first concentration is an ion concentration of about $2 \times 10^{15} cm^{-2}$, and said second concentration is an ion concentration of about $4 \times 10^{14} cm^{-2}$.

9. A semiconductor integrated circuit fabrication method according to claim 1, wherein said insulating layer is about 1500 to 2500 angstroms in thickness.

10. A semiconductor integrated circuit fabrication method according to claim 1, wherein part of said polysilicon that is not oxidized in said third step is disposed outside said isolated regions of said first conductive type conductive and functions as a resistor polysilicon region.

11. A semiconductor integrated circuit fabrication method according to claim 10, wherein, in said fourth step, the ends of said resistor polysilicon region are doped at said first concentration and the central part of said resistor polysilicon region is doped at said second concentration.

12. A semiconductor integrated circuit fabrication method according to claim 10, wherein, in said fourth step, the entire part of said resistor polysilicon region is doped at said first concentration.

13. A semiconductor integrated circuit fabrication method according to claim 12, wherein said first concentration is about $2.4 \times 10^{15} cm^{-2}$.

14. A semiconductor integrated circuit fabrication method, comprising:
  first, creating isolated regions of a first conductive type in a silicon substrate, depositing polysilicon on the principal surface of said silicon substrate including said isolated regions, and forming an oxidation-resistant layer on the exposed surface of said polysilicon;
  second, selectively removing parts of said oxidation-resistant layer and forming, in part of said isolated regions of said first conductive type not overlain by said oxidation-resistant layer, a first passive base region of a second conductive type;
  third, selectively oxidizing said polysilicon, using said oxidation-resistant layer as a mask, then removing said oxidation-resistant layer;
  fourth, introducing a dopant of said second conductive type at a first concentration into part of said plysilicon left unoxidized by said third step, and at a second concentration, lower than said first concentration, into all of said polysilicon left unoxidized by said third step;
  fifth, an annealing process followed by a doping process, said annealing process being carried out in a non-oxidizing atmosphere to create a second passive base region and an active base region of said second conductive type by diffusion of said dopant of said second conductive type from said polysilicon into said isolated regions of said conductive type, said second passive base and active base regions being contiguous with said first passive base region, and said doping process introducing a dopant of said first conductive type into selected parts of said polysilicon;
  sixth, depositing an insulating layer by chemical vapor deposition on both the oxidized and unoxidized parts of said polysilicon;
  seventh, creating by diffusion an emitter region of said first conductive type within said active base region, said diffusion being induced by annealing in a non-oxidizing atmosphere;
  eighth, opening contact holes in said insulation layer; and
  ninth, forming metal electrodes in said contact holes.

15. A semiconductor integrated circuit fabrication method according to claim 14, further comprising a step performed between said third step and said fourth step, for oxidizing said remaining unoxidized polysilicon surface to a thickness sufficient to prevent outdiffusion of the dopant in said polysilicon during said diffusion in said fifth step.

16. A semiconductor integrated circuit fabrication method according to claim 15, wherein said tenth step comprises oxidizing said remaining unoxidized polysilicon surface to a thickness of about 100 to 200 angstroms.

17. A semiconductor integrated circuit fabrication method according to claim 14, wherein said dopant of said second conductive type employed in said fourth step is boron, said fourth step is carried out by ion implantation at an energy of about 30keV, said first concentration is an ion concentration of about $2 \times 10^{15} cm^{-2}$, and said second concentration is an ion concentration of about $4 \times 10^{14} cm^{-2}$.

18. A semiconductor integrated circuit fabrication method according to claim 14, wherein said insulating layer is about 2000 angstroms in thickness.

19. A semiconductor integrated circuit fabrication method according to claim 14, wherein part of said polysilicon that is not oxidized in said third step is disposed outside said isolated regions of said first conductive type and functions as a resistor polysilicon region.

20. A semiconductor integrated circuit fabrication method according to claim 19, wherein, in said fourth step, the ends of said resistor polyisilicon region are doped at said first concentration and the central part of said resistor polysilicon region is doped at said second concentration.

21. A semiconductor integrated circuit fabrication method according to claim 19, wherein, in said fourth step, the entire part of said resistor polysilicon region is doped at said first concentration.

22. A semiconductor integrated circuit fabrication method according to claim 21, wherein said first concentration is about $2.4 \times 10^{15} cm^{-2}$.

23. A semiconductor integrated circuit fabrication method according to claim 19, wherein a dopant of said first conductive type is introduced into said resistor polysilicon region in said fifth step.

24. A semiconductor integrated circuit fabrication method, comprising:
  first, creating isolated regions of a first conductive type in a silicon substrate, depositing polysilicon on the principal surface of said silicon substrate including said isolated regions, and forming an oxidation-resistant layer on the exposed surface of said polysilicon;
  second, selectively removing parts of said oxidation-resistant layer and forming, in part of said isolated regions of said first conductive type not overlain by said oxidation-resistant layer, a first passive base region of a second conductive type;

third, selectively oxidizing said polysilicon, using said oxidation-resistant layer as a mask, then removing said oxidation-resistant layer;

fourth, introducing a dopant of said second conductive type at a first concentration into part of said polysilicon left unoxidized by said third step, and at a second concentration, lower than first concentration, into all of said polysilicon left unoxidized by said third step;

fifth, an annealing process followed by a doping process, said appealing process being carried out in a non-oxidizing atmosphere to create a second passive base region and an active base region of said second conductive type of diffusion of said dopant of said second conductive type from said polysilicon into said isolated regions of said first conductive type, said second passive base and active base regions being contiguous with said first passive base region, and said doping process introducing a dopant of said first conductive type into selected parts of said polysilicon;

sixth, creating by diffusion an emitter region of said first conductive type within said active base region, said diffusion being induced by annealing;

seventh, forming a metal silicide on the surface of selected portions of said polysilicon, including the polysilicon that will become the base electrode, then depositing an insulating layer by chemical vapor disposition on the entire surface of said polysilicon, including both oxidized and unoxidized parts and the part covered with metal silicide;

eighth, opening contact holes in said insulating layer; and ninth, forming metal electrodes in said contact holes.

25. A semiconductor integrated circuit fabrication method according to claim 24, further comprising a tenth performed between said third step and said fourth step, for oxidizing said remaining unoxidized polysilicon surface to a thickness sufficient to prevent outdiffusion of the dopant in said polysilicon during said diffusion in said fifth step.

26. A semiconductor integrated circuit fabrication method according to claim 25, wherein said tenth step comprises oxidizing said remaining unoxidized polysilicon surface to a thickness of about 100 to 200 angstroms.

27. A semiconductor integrated circuit fabrication method according to claim 24, wherein said dopant of said second conductive type employed in said fourth step is boron, said fourth step is carried out by ion implantation at an energy of about 30keV, said first concentration is an ion concentration of about $2 \times 10^{15} cm^{-2}$, and said second concentration is an ion concentration of about $4 \times 10^{14} cm^{-2}$.

28. A semiconductor integrated circuit fabrication method according to claim 24, wherein part of said polysilicon that is not oxidized in said third step is disposed outside said isolated regions of said first conductive type and functions as a resistor polysilicon region.

29. A semiconductor integrated circuit fabrication method according to claim 28, wherein, in said fourth step, the ends of said resistor polysilicon region are doped at said first concentration and the central part of said resistor polysilicon region is doped at said second concentration.

30. A semiconductor integrated circuit fabrication method according to claim 28, wherein, in said fourth step, the entire part of said resistor polysilicon region is doped at said first concentration.

31. A semiconductor integrated circuit fabrication method according to claim 30, wherein first concentration is about $2.4 \times 10^{15} cm^{-2}$.

32. A semiconductor integrated circuit fabrication method according to claim 28, wherein a dopant of said first conductive type is introduced into said resistor polysilicon region in said fifth step.

33. A semiconductor integrated circuit fabrication method according to claim 1, wherein said selectively oxidizing third step leaves unoxidized the polysilicon that will become a base electrode, and said polysilicon is so formed as to have a thickness that is desired when the polysilicon is used as the base electrode.

34. A semiconductor integrated circuit fabrication method, comprising:

first, creating isolated regions of a first conductivity type in a silicon substrate, depositing polysilicon on the principal surface of said silicon substrate including said isolated regions, and forming an oxidation-resistant layer on the exposed surface of said polysilicon;

second, selectively removing parts of said oxidation-resistant layer and forming, in a first part of said isolated regions not overlain by said oxidation-resistant layer, a first passive base of a second conductivity type;

third, selectively oxidizing said polysilicon, using said oxidation-resistant layer as a mask, to leave unoxidized polysilicon, and then removing said oxidation-resistant layer;

fourth, introducing a dopant of said second conductivity type at a first concentration into a first part of said unoxidized polysilicon over the region which will become a second passive base, and at a second concentration lower than said first concentration into said first part of said unoxidized polysilicon and a second part of said unoxidized polysilicon over the region which will become an active base region;

fifth, depositing an insulating layer on both the oxidized and unoxidized parts of said polysilicon surface by chemical vapor deposition, then diffusing said dopant of said second conductivity type from said polysilicon into said isolated regions of said first conductivity type to form said second passive base region and said active base region of said second conductivity type, said first passive base region being contiguous with said second passive base region and said active base region;

sixth, selectively removing parts of said insulating layer to create contact holes in which the surface of said polysilicon is exposed;

seventh, introducing a dopant of said first conductivity type into said exposed polysilicon over said active base region; eighth, diffusing said dopant of said first conductivity type to create an emitter region of said first conducitivity type within said active base region; and ninth, forming metal electrodes in said contact holes.

35. A semiconductor integrated circuit fabrication method according to claim 34, wherein said polysilicon is deposited in said first step with a thickness that is desired when said polysilicon is used as an electrode for connecting said second passive base and said contact hole formed on said polysilicon.

36. A semiconductor integrated circuit fabrication method, comprising:

first, creating isolated regions (3) of a first conductivity type (N) in a silicon substrate (1), depositing polysilicon (6) on the principal surface of said silicon substrate including said isolated regions, and forming an oxidation-resistant layer (7) on the exposed surfaces of said polysilicon;

second, selectively removing parts of said oxidation-resistant layer (7) and forming, in a first part of said isolated regions (3) not overlain by said oxidation-resistant layer (7), a first passive base region (9) of a second conductivity type (P);

third, selectively oxidizing said polysilicon (6), using said oxidation-resistant layer (7) as a mask, to leave unoxidized polysilicon, and then removing said oxidation-resistant layer;

fourth, introducing a dopant (B) of said second conductivity type at a first concentration into a first part of said unoxidized polysilicon over the region (13) which will become a second passive base and second and third parts of said unoxidized polysilicon which will become ends of a resistor ($6_4$) and at a second concentration lower than said first concentration into said first, second, and third parts of said unoxidized polysilicon and a fourth part of said unoxidized polysilicon over the region (18) which will become an active base region, a fifth part of said unoxidized polysilicon over the region which will become a collector sink region (5), and a sixth part of unoxidized polysilicon which will become a trunk of said resistor ($6_4$);

fifth, depositing an insulating layer (22) on both the oxidized and unoxidized parts of said polysilicon surface by chemical vapor deposition, then difussing said dopant of said second conductivity type (P) from said polysilicon into said isolated regions of said first conductivity type to form said second passive base region (13) and said active base region (14) of said second conductivity type, said fist passive base region being contiguous with said passive base region (13) and said active base region (14);

sixth, selectively removing parts of said insulating layer to create contact holes (15) in which the surface of said polysilicon (6, $6_2$, $6_3$, $6_4$) is exposed;

seventh, introducing a dopant of said first conductivity type (N) into said exposed polysilicon ($6_2$) over said active base region (14);

eighth, diffusing said dopant of said first conductivity type (N) to create an emitter region (18) of said first conductivity type within said active base region (14); and ninth, forming metal electrodes in said contact holes (15).

37. A semiconductor integrated circuit fabrication method according to claim 36, wherein said polysilicon is deposited in said first step with a thickness that is desired when said polysilicon is used an electrode/lead for connecting said passive base (13) and said contact hole (15) formed on said polysilicon ($6_1$).

38. The method of claim 1 wherein said step of depositing polysilicon creates a relatively thin layer of polysilicon thereby to reduce variations in the amount of dopant from said fourth step which is actually introduced into regions underlying said polysilicon.

39. The method of claim 14 wherein said step of depositing polysilicon creates a relatively thin layer of polysilicon thereby to reduce variations in the amount of dopant from said fourth step which is actually introduced into regions underlying said polysilicon.

40. The method of claim 24 wherein said step of depositing polysilicon creates a relatively thin layer of polysilicon thereby to reduce variations in the amount of dopant from said fourth step which is actually introduced into regions underlying said polysilicon.

41. The method of claim 34 wherein said step of depositing polysilicon creates a relatively thin layer of polysilicon thereby to reduce variations in the amount of dopant from said fourth step which is actually introduced into regions underlying said polysilicon.

42. The method of claim 36 wherein said step of depositing polysilicon creates only a relatively thin layer of polysilicon thereby to reduce variations in the amount of dopant from said fourth step which is actually introduced into regions underlying said polysilicon.

* * * * *

UNITED STATES PATENT AND TRADEMARK OFFICE
CERTIFICATE OF CORRECTION

PATENT NO. : 4,946,798

DATED : August 7, 1990

INVENTOR(S) : Akira Kawakatsu

It is certified that error appears in the above-identified patent and that said Letters Patent is hereby corrected as shown below:

Col. 2, line 51, change "forming" to --forms--.

Change "conductive" to --conductivity-- at all of the following locations:

Col. 2, lines 46, 55, and 64;
Col. 7, line 61;
Col. 8, (claim 1) lines 4, 11, 13, 18, 27, 28, 29, 36, 39 and 40;
Col 8, (claim 3) lines 49-50;
Col. 9, (claim 8) line 10;
Col. 9, (claim 14) lines 48, 50, 54, 64, 65 and 66, thru
col. 10, lines 2 and 8;
Col. 10, (claim 17) line 28;
Col. 10, (claim 19) line 40;
Col. 10, (claim 23) line 57;
Col. 10, (claim 24) line 61, col. 11. lines 3, 7, 17, 18, 19, 23 and 26;
Col. 11, (claim 27) line 54;
Col. 11, (claim 28) line 63;
Col. 12, (claim 32) line 12;

Col. 9, (claim 8) line 11, correct the spelling of "about".

Signed and Sealed this

Twenty-second Day of September, 1992

Attest:

DOUGLAS B. COMER

Attesting Officer     Acting Commissioner of Patents and Trademarks